United States Patent
Gambino et al.

(10) Patent No.: US 8,236,683 B2
(45) Date of Patent: Aug. 7, 2012

(54) CONDUCTOR STRUCTURE INCLUDING MANGANESE OXIDE CAPPING LAYER

(75) Inventors: Jeffrey Peter Gambino, Westford, VT (US); Stephen Ellinwood Luce, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 62 days.

(21) Appl. No.: 13/016,340

(22) Filed: Jan. 28, 2011

(65) Prior Publication Data

US 2011/0136339 A1 Jun. 9, 2011

Related U.S. Application Data

(62) Division of application No. 11/872,796, filed on Oct. 16, 2007, now Pat. No. 7,884,475.

(51) Int. Cl.
*H01L 21/4763* (2006.01)
(52) U.S. Cl. ........ 438/629; 438/637; 438/672; 438/675; 438/627; 438/653
(58) Field of Classification Search .............. 438/629, 438/637, 672, 675, 627, 653
See application file for complete search history.

(56) References Cited

U.S. PATENT DOCUMENTS

| | | | |
|---|---|---|---|
| 6,881,994 B2 | 4/2005 | Lee et al. | |
| 7,129,133 B1 | 10/2006 | Avanzino et al. | |
| 7,304,384 B2 | 12/2007 | Koike et al. | |
| 7,361,586 B2 * | 4/2008 | Adem et al. | 438/629 |
| 2005/0227382 A1 | 10/2005 | Hui | |

OTHER PUBLICATIONS

Koike, et al. "Cu Alloy Metalization for Self-Forming Barrier Process," Proceedings IEEE International Interconnect Technology Conference (IITC) 2006, pp. 161-163, IEEE I-4244-0103 Mar. 2006.
Gambino et al., "Optimization of Cu Interconnect Layers for CMOS Image Sensor Technology," Advanced Metalization Conference (AMC) Proceedings 2005, pp. 151-156.

* cited by examiner

*Primary Examiner* — Eugene Lee
(74) *Attorney, Agent, or Firm* — Scully, Scott, Murphy & Presser, P.C.; Richard M. Kotulak, Esq.

(57) ABSTRACT

A microelectronic structure includes a dielectric layer located over a substrate. The dielectric layer is separated from a copper containing conductor layer by an oxidation barrier layer. The microelectronic structure also includes a manganese oxide layer located aligned upon a portion of the copper containing conductor layer not adjoining the oxidation barrier layer. A method for fabricating the microelectronic structure includes sequentially forming and sequentially planarizing within an aperture within a dielectric layer an oxidation barrier layer, a manganese containing layer (or alternatively a mobile and oxidizable material layer) and finally, a planarized copper containing conductor layer (or alternatively a base material layer comprising a material less mobile and oxidizable than the mobile and oxidizable material layer) to completely fill the aperture. The manganese layer and the planarized copper containing conductor layer are then thermally oxidized to form a manganese oxide layer self aligned to a portion of the copper containing conductor layer not adjoining the oxidation barrier layer.

12 Claims, 2 Drawing Sheets

CONDUCTOR STRUCTURE INCLUDING MANGANESE OXIDE CAPPING LAYER

CROSS REFERENCE TO RELATED APPLICATIONS

This application is a divisional of U.S. patent application Ser. No. 11/872,796, filed Oct. 16, 2007 the entire content and disclosure of which is incorporated herein by reference.

BACKGROUND

1. Field of the Invention

The invention relates generally to conductor layers within microelectronic structures. More particularly, the invention relates to enhanced performance conductor layers within microelectronic structures.

2. Description of the Related Art

In addition to active devices (i.e., such as but not limited to transistors and diodes), as well as passive devices (i.e., such as but not limited to capacitors and resistors), microelectronic circuits, such as but not limited to semiconductor circuits, typically include patterned conductor layers that are separated by dielectric layers. The patterned conductor layers are generally used for connecting and interconnecting the active devices and the passive devices to provide fully functional microelectronic circuits.

As microelectronic technology, and in particular semiconductor technology, has advanced, and microelectronic device dimensions have decreased, the dimensions of patterned conductor layers that are used for connecting and interconnecting microelectronic devices within microelectronic circuits have also decreased. As a result of these decreased patterned conductor layer dimensions, various detrimental and undesirable effects may become more pronounced within microelectronic circuits. Included among these detrimental and undesirable effects are electromigration effects.

In an effort of provide for enhanced electrical performance within advanced microelectronic circuits, patterned conductor layers now routinely comprise copper containing conductor materials, insofar as copper containing conductor materials provide enhanced electrical properties (i.e., such as but not limited to electromigration resistance properties) in comparison with patterned conductor layers comprised of other conductor materials, such as aluminum containing conductor materials. While patterned conductor layers that comprise copper containing conductor materials are thus desirable within the microelectronic fabrication art, patterned conductor layers that comprise copper containing conductor materials are nonetheless also not entirely without problems. In particular, patterned conductor layers that comprise copper containing conductor materials are often susceptible to interdiffusion with surrounding dielectric materials, such as in particular surrounding silicon oxide dielectric materials. Such interdiffusion may compromise the integrity of both the conductor layer comprised of the copper containing conductor material, as well as the surrounding silicon oxide dielectric material.

Various microelectronic metallization structures having desirable properties, including copper containing metallization structures having desirable properties, are known in the microelectronic fabrication art.

For example, Koike, et al., in "Cu Alloy Metallization for Self-Forming Barrier Process," Proceedings IEEE International Interconnect Technology Conference (IITC) 2006, pp. 161-63, IEEE 1-4244-0103-3/06, teaches a thermal annealing method for forming a barrier layer interposed between a silicon oxide dielectric layer and a copper containing conductor layer within a microelectronic conductor structure. The thermal annealing method uses a copper-manganese alloy seed layer for a plated copper containing conductor layer, where upon thermal annealing, manganese within the copper-manganese alloy seed layer reacts with an adjoining silicon oxide dielectric material to form a self aligned manganese oxide barrier layer.

In addition, Gambino et al., in "Optimization of Cu Interconnect Layers for CMOS Image Sensor Technology," Advanced Metallization Conference (AMC) Proceedings 2005, pp. 151-56, teaches various configurations of copper interconnect structures that may be used for fabricating CMOS image sensors. Included in particular is a copper interconnect structure that includes a cobalt-tungsten-phosphorus alloy self-aligned capping layer.

Microelectronic conductor dimensions are certain to continue to decrease as microelectronic structure and device dimensions, including semiconductor structure and device dimensions, decrease. Thus, desirable are enhanced performance conductor structures for use within microelectronic structures, as well as methods for fabricating those enhanced performance conductor structures.

SUMMARY

The invention includes a microelectronic conductor structure and a method for fabricating the microelectronic conductor structure. A microelectronic conductor structure in accordance with the invention includes a copper containing conductor layer that is separated from a dielectric layer by an oxidation barrier layer. In addition, a manganese oxide layer is located upon a portion of copper containing conductor layer that does not adjoin the oxidation barrier layer. The foregoing microelectronic conductor structure may be fabricated using a self-aligned method that uses a manganese containing layer (i.e., typically a copper-manganese alloy seed layer), which adjoins the oxidation barrier layer. Upon thermal oxidation annealing, the manganese within the manganese containing layer migrates to a portion of the copper containing conductor layer (i.e., typically a plated copper containing conductor layer) not adjoining the oxidation barrier layer, where the manganese is oxidized to form a self aligned manganese oxide capping layer upon a portion of the copper containing conductor layer that does not adjoin the oxidation barrier layer.

In light of the foregoing disclosure, a more general method in accordance with the invention is assumed applicable for an impurity containing layer (i.e., generally in place of the manganese containing layer) comprising an impurity that: (1) has a higher mobility; and (2) is more oxidation prone, than a base metal layer (i.e., in place of the copper containing conductor layer) through which it diffuses. Determination of suitable alternative materials combinations for the impurity containing layer and the base material layer are not considered to require undue experimentation. Rather, in a first instance, a determination of oxidation potentials and appropriate diffusion coefficients may provide appropriate impetus for candidate materials selections.

A particular microelectronic structure in accordance with the invention includes a copper containing conductor layer separated from a dielectric layer located over a substrate by an oxidation barrier layer. The microelectronic structure also includes a manganese oxide layer located upon a portion of the copper containing conductor layer that does not adjoin the oxidation barrier layer.

A particular method for fabricating a microelectronic structure in accordance with the invention includes forming an oxidation barrier layer within an aperture located within a dielectric layer located over a substrate. This particular method also includes forming an oxidizable and diffusion prone material containing layer upon the oxidation barrier layer. An oxidizable and diffusion prone material within the oxidizable and diffusion prone material layer is more oxidizable and diffusion prone than a base material layer subsequently formed upon the oxidizable and diffusion prone material containing layer. This particular method also includes thermally oxidizing the oxidizable and diffusion prone material containing layer and the base material layer to form a self-aligned oxidized diffusion prone material upon a portion of the base material layer not adjoining the oxidation barrier layer.

Another particular method for fabricating a microelectronic structure in accordance with the invention includes forming an oxidation barrier layer within an aperture located within a dielectric layer located over a substrate. The method also includes forming a manganese containing layer upon the oxidation barrier layer. The method also includes forming a planarized copper containing conductor layer filling the aperture. The method also includes thermally oxidizing the manganese containing layer and the planarized copper containing conductor layer to form a self-aligned manganese oxide layer upon a portion of the copper containing conductor layer not adjoining the oxidation barrier layer.

BRIEF DESCRIPTION OF THE DRAWINGS

The objects, features and advantages of the invention are understood within the context of the Description of the Preferred Embodiment, as set forth below. The Description of the Preferred Embodiment is understood within the context of the accompanying drawings, that form a material part of this disclosure, wherein.

DESCRIPTION OF THE PREFERRED EMBODIMENT

The invention, which includes a microelectronic conductor structure and a method for fabricating the microelectronic conductor structure, is understood within the context of the description set forth below. The description set forth below is understood within the context of the drawings described above. Since the drawings are intended for illustrative purposes, the drawings are not necessarily drawn to scale.

Figure 1:
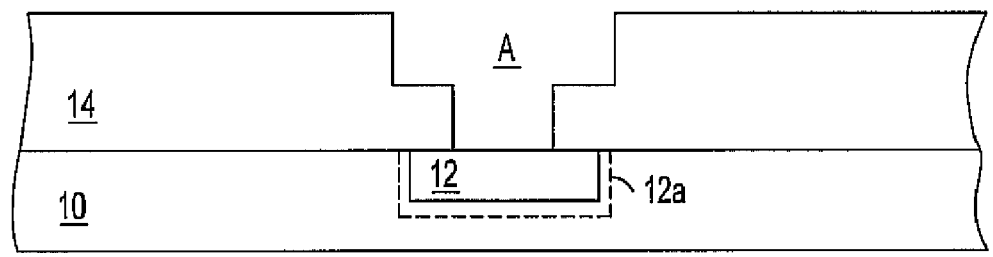
FIG. 1 to FIG. 6 show a series of schematic cross-sectional diagrams illustrating the results of progressive stages in fabricating a microelectronic structure in accordance with an embodiment of the invention.

FIG. 1 to FIG. 6 show a series of schematic cross-sectional diagrams illustrating the results of progressive stages in fabricating a microelectronic conductor structure in accordance with an embodiment of the invention. This particular embodiment of the invention comprises a sole preferred embodiment of the invention. FIG. 1 shows a schematic cross-sectional diagram of the microelectronic conductor structure at an early stage in the fabrication thereof in accordance with this particular sole preferred embodiment.

FIG. 1 shows a substrate 10. A conductor contact layer 12 is located embedded within the substrate 10. A dielectric layer 14 that defines an aperture A is located upon the substrate 10 to expose a portion of the conductor contact layer 12. Each of the foregoing substrate 10, conductor contact layer 12 and dielectric layer 14 may comprise materials, have dimensions and be formed using methods that are otherwise generally conventional in the microelectronic fabrication art.

The substrate 10 may comprise any of several materials, including but not limited to dielectric substrate materials, such as but not limited to ceramic substrate materials, as well as semiconductor substrate materials. Particular non-limiting examples of ceramic substrate materials include silica, titania, zirconia and alumina ceramic materials, as well as laminates of the foregoing ceramic materials and composites of the foregoing ceramic materials. More particularly, the substrate 10 when comprising a semiconductor material may comprise any of several semiconductor materials. Non-limiting examples include silicon, germanium, silicon-germanium alloy, silicon-carbon alloy, silicon-germanium-carbon alloy and compound (i.e., III-V and II-VI) semiconductor materials. Non-limiting examples of compound semiconductor materials include gallium arsenide, indium arsenide and indium phosphide semiconductor materials. Typically, the substrate 10 has a thickness from about 1 to about 3 mils.

While the present particularly described embodiment illustrates the invention most particularly and desirably within the context of a substrate 10 that comprises a bulk semiconductor substrate, the embodiment is not intended to be so limited. Rather, the embodiment and the invention also contemplate the use of a semiconductor-on-insulator substrate or a hybrid orientation substrate for the substrate 10, when the substrate 10 comprises a semiconductor substrate. A semiconductor-on-insulator substrate includes a base semiconductor substrate that is separated from a surface semiconductor layer by a buried dielectric layer. A hybrid orientation substrate includes multiple semiconductor regions of different crystallographic orientation supported upon a single substrate.

Although not specifically illustrated within the schematic cross-sectional diagram of FIG. 1, when the substrate 10 comprises at least in-part a semiconductor substrate or at least in-part a surface semiconductor layer, the substrate 10 will preferably have microelectronic devices located and fabricated therein and/or thereupon. Such microelectronic devices may include, but are not necessarily limited to, resistors, transistors, diodes and capacitors.

The conductor contact layer 12 comprises a conductor material. Such a conductor material may comprise any of several metals, metal alloys, metal nitrides and metal silicides, as well as laminates of the foregoing materials and composites of the foregoing materials. Desirable for the conductor contact layer 12 are titanium, tungsten and copper metals, as well as laminates thereof and alloys thereof. Copper is a particularly common conductor contact layer 12 metal, which will typically include a barrier layer (i.e., such as a barrier layer 12a that is illustrated in FIG. 1 in phantom, but omitted in subsequent drawing figures for clarity) to separate the conductor contact layer 12 from remaining portions of the substrate 10 (i.e., where such remaining portions of the substrate 10 will typically include a dielectric material). Such barrier layers may comprise materials including but not limited to titanium materials and tantalum materials, as well as nitrides of titanium materials, tantalum materials and tungsten materials.

The first dielectric layer 14 may comprise any of several dielectric materials. The first dielectric layer 14 may comprise generally higher dielectric constant dielectric materials (i.e., having a dielectric constant from about 4 to about 20) such as but not limited to oxides, nitrides and oxynitrides of silicon. The first dielectric layer 14 may alternatively comprise generally lower dielectric constant dielectric materials (i.e., having a dielectric constant from about 2.5 to about 4). Such lower dielectric constant dielectric materials may include, but are not necessarily limited to microporous dielectric materials, nanoporous dielectric materials, spin-on-glass dielectric materials and spin-on-polymer dielectric materials. The first dielectric layer 14 may be formed using otherwise generally conventional methods that are appropriate to the material of composition of the first dielectric layer 14. Representative non-limiting methods include thermal or plasma oxidation or nitridation methods, spin-coating methods, chemical vapor deposition methods and physical vapor deposition methods. Typically, the first dielectric layer 14 has a thickness from about 1000 to about 5000 angstroms.

As is understood by a person skilled in the art, the aperture A that is illustrated in FIG. 1 comprises a dual damascene aperture. The dual damascene aperture includes a via aperture at the base of which is exposed the first conductor layer 12. The dual damascene aperture also includes a trench aperture overlapping the via aperture. Although the dual damascene aperture may be formed using particular etch stop layers for proper positioning of the trench aperture with respect to the via aperture, those particular layers, or related structures, are not illustrated in FIG. 1 or any subsequent drawing figures, for clarity.

Figure 2:
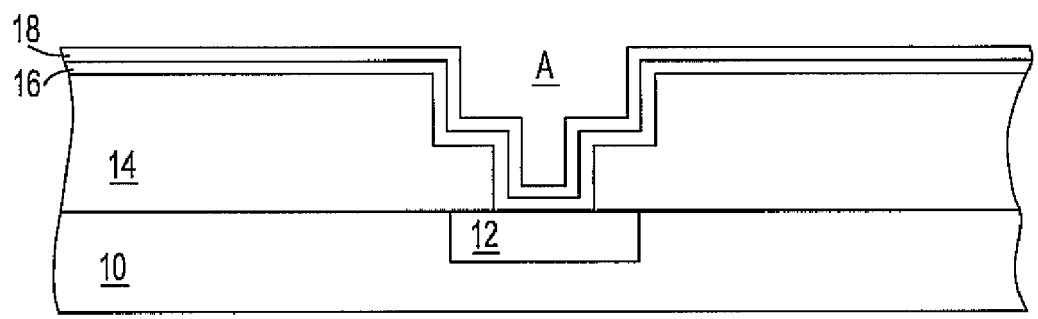

FIG. 2 shows an oxidation barrier layer 16 located and formed upon the microelectronic structure of FIG. 2 and not completely filling the aperture A. FIG. 2 also shows a manganese containing layer 18 located and formed upon the oxidation barrier layer 16 and also not completely filling the aperture A.

The oxidation barrier layer 16 comprises an oxidation barrier material. Suitable oxidation barrier materials may include, but are not necessarily limited to, oxidation barrier conductor materials and oxidation barrier dielectric materials. Either an oxidation barrier conductor material or an oxidation barrier dielectric material may be used for the oxidation barrier layer 16 while still providing an operative invention. However, since this particular instant embodiment seeks to maintain electrical continuity to the conductor contact layer 12, within the instant embodiment the oxidation barrier layer 16 preferably comprises a conductor oxidation barrier material.

Suitable conductor oxidation barrier materials from which may be comprised the oxidation barrier layer 16 include oxidation resistant metals, metal alloys and metal nitrides, most of which comprise refractory materials. Non-limiting examples of such oxidation resistant metals, metal alloys and metal nitrides include titanium, tantalum and tungsten materials, alloys of those materials and nitrides of those materials. The foregoing conductor oxidation barrier materials may be located and formed in-part upon the microelectronic structure of FIG. 1 to provide in part the microelectronic structure of FIG. 2 while using deposition methods that are otherwise generally conventional in the microelectronic fabrication art. Included in particular are chemical vapor deposition methods and physical vapor deposition methods. Typically, the oxidation barrier layer 16 comprises a tantalum conductor oxidation barrier material, or a nitride thereof. Typically, such an oxidation barrier layer 16 has a thickness from about 10 to about 200 angstroms.

The manganese containing layer 18 may comprise any of several manganese containing materials. Particular manganese containing materials, include, but are not necessarily limited to pure manganese and manganese alloys. Particular common are manganese-copper alloy seed layers, although such manganese-copper alloy seed layers by no means limit the embodiment. Typically such a manganese-copper alloy seed layer has a manganese content from about 1 to about 1.0 atomic percent. Within the context of the embodiment, such a manganese containing layer (i.e., in particular such as a manganese-copper alloy seed layer) may be formed using methods that are otherwise generally conventional in the microelectronic fabrication art. Included but not limiting are ion sputtering methods, chemical vapor deposition methods and physical vapor deposition methods. Typically, the manganese containing layer 16 comprises a manganese-copper alloy seed layer that has a manganese content from about 1 to about 10 atomic percent and a thickness from about 20 to about 1000 angstroms.

Figure 3:
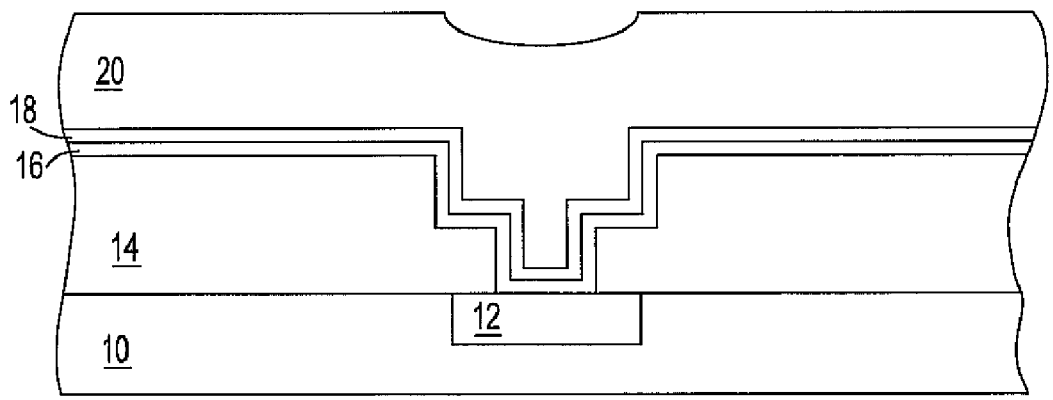

FIG. 3 shows a copper containing conductor layer 20 located and formed upon the manganese containing layer 18 that is illustrated in FIG. 2. Although not necessarily a limitation of the particular embodiment, the copper containing conductor layer 20 is typically deposited using a plating method. Other deposition methods, such as but not limited to chemical vapor deposition methods and physical vapor deposition methods, are not excluded. The copper containing conductor layer 20 may include pure copper, or in an alternative the copper containing conductor layer 20 may comprise a copper alloy. Such a copper alloy comprises at least about 95 weight percent copper. The copper containing conductor layer is formed to a thickness sufficient to overfill the aperture A that is illustrated in FIG. 1 and FIG. 2.

Although not specifically illustrated within the schematic cross-sectional diagram of FIG. 3, the microelectronic structure whose schematic cross-sectional diagram is illustrated in FIG. 3 may be thermally annealed at a generally and comparatively low temperature of about 50 to about 200 degrees centigrade for a time period from about 1 to about 60 minutes. Such a generally low temperature thermal annealing is undertaken for purposes of promoting grain growth in the copper containing conductor layer 20.

Figure 4:
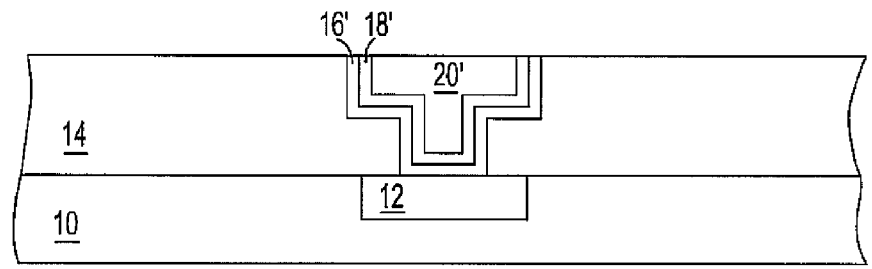

FIG. 4 shows a copper containing conductor layer 20', a manganese containing layer 18' and an oxidation barrier layer 16' that result from planarizing the microelectronic structure of FIG. 3. Such planarization may be effected while using the first dielectric layer 14 as a planarizing stop layer. In addition, such planarization may be effected using planarizing methods that are otherwise generally conventional in the microelectronic fabrication art. Non-limiting examples of such planarization methods include mechanical planarizing methods and chemical mechanical polish planarizing methods. More particularly common are chemical mechanical polish planarizing methods.

Figure 5:
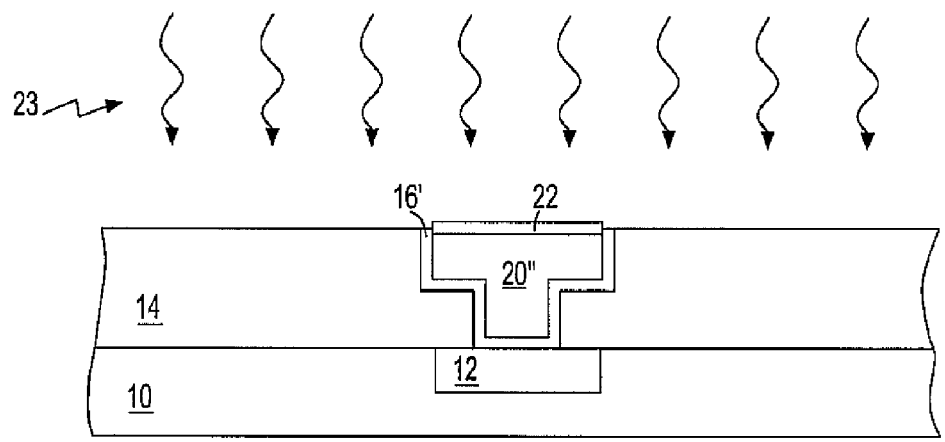

FIG. 5 shows the results of thermal oxidation annealing of the semiconductor structure of FIG. 4. Such thermal oxidation annealing is typically undertaken at a temperature substantially higher than the comparatively mild thermal annealing that may be used in conjunction with fabricating the semiconductor structure whose schematic cross-sectional diagram is illustrated in FIG. 3. As a result of the foregoing general higher temperature thermal oxidation annealing, manganese within the manganese containing layer 18' thermally migrates to a thermal oxidation source 23 at an upper surface of the copper containing conductor layer 20' that is neither adjacent nor adjoining the oxidation barrier layer 16'. As a result of this thermal migration of manganese, a definitive manganese containing layer 18' no longer exists adjoining the oxidation barrier layer 16', but rather boundaries of the copper containing conductor layer 20' expand to form a copper containing conductor layer 20". Finally, at the upper surface of copper containing conductor layer 20", a self-aligned manganese oxide capping layer 22 is formed as a result of oxidation of the diffused manganese.

Within the context of the instant embodiment, the foregoing thermal oxidation annealing is typically undertaken at a temperature from about 350 to about 450 degrees centigrade for a time period from about 1 to about 60 minutes. The foregoing thermal oxidation annealing may also be undertaken using any of several types of oxidants. Non-limiting examples include oxygen, ozone, nitrous oxide and nitric oxide oxidants although oxygen (i.e., molecular oxygen) oxidants are particularly common. Typically, the thermal oxidation annealing uses an oxygen content from about 1 to about 1000 ppm by volume in an argon carrier gas at an overall reactor chamber pressure from about 0.1 to about 760 torr.

While not wishing to be bound by any particular theory of operation of the instant embodiment, it is believed that in comparison with copper, manganese has a generally higher thermal mobility, as well as an enhanced thermodynamic affinity for forming an oxidation product. Koike, as cited within the Description of the Related Art, teaches that manganese possesses the foregoing properties, as well as other properties that make manganese a desirable material within a copper alloy for forming a barrier layer incident to a self aligned thermal oxidation reaction.

Figure 6:
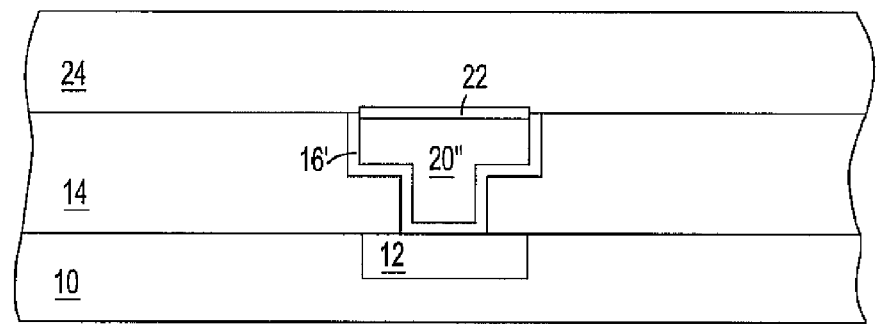

FIG. 6 shows a second dielectric layer 24 located upon the microelectronic structure of FIG. 5. The second dielectric 24 may comprise a dielectric material or materials, have dimensions and be formed using methods that are otherwise analogous, equivalent or identical to the materials, dimensions and methods that are used for forming the first dielectric layer 14. As is illustrated within the schematic cross-sectional diagram of FIG. 6, the second dielectric layer 24 may be formed directly upon the microelectronic structure of FIG. 5 absent an independent intervening barrier layer located and formed upon the microelectronic structure of FIG. 5, insofar as the manganese oxide layer 22 provides instead such a self-aligned barrier layer that inhibits interdiffusion of a copper containing conductor material within the copper containing conductor layer 20" with a silicon oxide material that may comprise the second dielectric layer 24.

FIG. 6 shows a schematic cross-sectional diagram of a microelectronic structure in accordance with a preferred embodiment of the invention. The microelectronic structure includes a copper containing conductor layer 20" that is separated from a dielectric layer 14 by an oxidation barrier layer 16'. A portion of the copper containing conductor layer 20" that does not adjoin, nor is adjacent, the oxidation barrier layer 16' has a manganese oxide layer 22 located and formed aligned thereupon. Due to the presence of the manganese oxide layer 22, the microelectronic structure of FIG. 6 may be further fabricated absent any additional intervening barrier layer covering the surface of the copper containing conductor layer 20". A method for fabricating the microelectronic structure in accordance with the invention is predicated upon thermal diffusion and thermal oxidation of a manganese material from a manganese containing layer adjoining the oxidation barrier layer, to a portion of the copper containing conductor layer 20" that does not adjoin, nor is adjacent, the oxidation barrier layer 16'.

The preferred embodiment is illustrative of the invention rather than limiting of the invention. Revisions and modifications may be made to methods, materials, structures and dimensions of a microelectronic structure in accordance with the preferred embodiment, while still providing a microelectronic structure and a method for fabrication thereof in accordance with the invention, further in accordance with the accompanying claims.

What is claimed is:

1. A method for fabricating a conductor structure comprising:
   forming an oxidation barrier layer within an aperture located within a dielectric layer located over a substrate;
   forming an oxidizable and diffusion prone material containing layer upon the oxidation barrier layer, an oxidizable and diffusion prone material within the oxidizable and diffusion prone material layer being more oxidizable and diffusion prone than a base material layer subsequently formed upon the oxidizable and diffusion prone material containing layer; and
   thermally oxidizing the oxidizable and diffusion prone material containing layer and the base material layer to form a self-aligned oxidized diffusion prone material upon a portion of the base material layer not adjoining the oxidation barrier layer.

2. The method of claim 1 wherein the aperture comprises a dual damascene aperture.

3. The method of claim 1 wherein the forming the oxidation barrier layer does not completely fill the aperture.

4. The method of claim 1 wherein the forming the oxidizable and diffusion prone material layer does not completely fill the aperture.

5. The method of claim 1 wherein the base material layer does completely fill the aperture.

6. The method of claim 1 wherein the thermally oxidizing uses an oxidant selected from the group consisting of oxygen, ozone, nitric oxide and nitrogen dioxide.

7. A method for fabricating a conductor structure comprising:
   forming an oxidation barrier layer within an aperture located within a dielectric layer located over a substrate;
   forming a manganese containing layer upon the oxidation barrier layer;
   forming a planarized copper containing conductor layer filling the aperture; and
   thermally oxidizing the manganese containing layer and the planarized copper containing conductor layer to form a self-aligned manganese oxide layer upon a portion of the copper containing conductor layer not adjoining the oxidation barrier layer.

8. The method of claim 7 wherein the aperture comprises a dual damascene aperture.

9. The method of claim 7 wherein the forming the oxidation barrier layer does not completely fill the aperture.

10. The method of claim 7 wherein the forming the manganese containing layer does not completely fill the aperture.

11. The method of claim 7 wherein the thermally oxidizing uses a temperature from about 350 to about 450 degrees centigrade.

12. The method of claim 7 wherein the thermally oxidizing uses an oxidant selected from the group consisting of oxygen, ozone, nitric oxide and nitrogen dioxide.

* * * * *